US007492646B2

(12) United States Patent
Lee et al.
(10) Patent No.: US 7,492,646 B2
(45) Date of Patent: Feb. 17, 2009

(54) INTERNAL VOLTAGE GENERATOR OF SEMICONDUCTOR DEVICE

(75) Inventors: Jong-Chern Lee, Kyoungki-do (KR); Sun-Hye Shin, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/717,662

(22) Filed: Mar. 14, 2007

(65) Prior Publication Data

US 2008/0001582 A1 Jan. 3, 2008

(30) Foreign Application Priority Data

Jun. 30, 2006 (KR) ..................... 10-2006-0060051

(51) Int. Cl.
*G11C 5/14* (2006.01)

(52) U.S. Cl. ............................ 365/189.09; 365/189.07

(58) Field of Classification Search ............ 365/189.09, 365/189.07, 226, 210; 327/198, 538
See application file for complete search history.

(56) References Cited

U.S. PATENT DOCUMENTS 5,189,316 A 2/1993 Murakami et al.
5,280,455 A * 1/1994 Kanaishi ..................... 365/229
5,493,234 A * 2/1996 Oh .............................. 326/33
6,025,707 A 2/2000 Joo
6,130,829 A 10/2000 Shin
6,150,860 A * 11/2000 Chun ......................... 327/198
7,046,576 B2 5/2006 Kim et al.
2006/0091937 A1* 5/2006 Do ............................. 327/538
2006/0140019 A1 6/2006 Lee

FOREIGN PATENT DOCUMENTS

JP 9-106676 4/1997
KR 10-2000-0007228 2/2000

OTHER PUBLICATIONS

Korean Office Action, with English translation, issued in Korean Patent Application No. KR 10-2006-0060051, mailed Aug. 28, 2007.

* cited by examiner

*Primary Examiner*—Gene N. Auduong
(74) *Attorney, Agent, or Firm*—McDermott Will & Emery LLP

(57) ABSTRACT

An internal voltage generator of a semiconductor memory device is capable of changing driving abilities between standby and active modes, to respond faster in the active mode and prevent a leakage current in the standby mode. The internal voltage generator of a semiconductor memory device comprises a driving controller for generating drive control signals having information about standby and active modes, a first voltage generator enabled by the drive control signals for comparing an internal voltage with a reference voltage in the standby and active modes, a first driver for generating the internal voltage according to a comparison performed by the first voltage generator, a second voltage generator enabled by the drive control signal for comparing the internal voltage with the reference voltage in the active mode, and a second driver for generating the internal voltage according to a comparison performed by the second voltage generator.

11 Claims, 3 Drawing Sheets

INTERNAL VOLTAGE GENERATOR OF SEMICONDUCTOR DEVICE

CROSS-REFERENCE TO RELATED APPLICATIONS

The present invention claims priority of Korean patent application number 10-2006-0060051, filed in the Korean Patent Office on Jun. 30, 2006, which is incorporated by reference in its entirety.

BACKGROUND OF THE INVENTION

The present invention relates to a semiconductor memory device; more particularly, to an internal voltage generator of a semiconductor memory device.

As a semiconductor chip is more highly integrated, each of plural cells in the semiconductor chip is downsized. A voltage level for operating the semiconductor chip is also decreased. Most semiconductor chips are provided with external supply voltages for supplying a power voltage to the semiconductor device and an internal voltage generator for generating plural internal voltages from the external supply voltages. Examples of internal voltages generated by the internal voltage generator include a bit line precharge voltage (VBLP) precharged to a bit line pair and a cell plate voltage (VCP) supplied to a cell plate. The VBLP and the VCP generally have an identical voltage level.

FIG. 1 illustrates a block diagram of a conventional internal voltage generator. The internal voltage generator includes a mirror-type amplifier 100 and an output driver 110. The mirror-type amplifier 100 compares a reference voltage VREF with an internal voltage. The output driver 110 outputs the VBLP according to a comparing result. Drive control signals OFF and OFFB, input to the mirror-type amplifier 100, determine whether the mirror-type amplifier 100 operates or not. The reference voltage VREF is half of the level of a core voltage VCORE generally.

FIG. 2 illustrates a schematic circuit diagram of the internal voltage generator described in FIG. 1. The mirror-type amplifier 100, enabled by the drive control signals OFF and OFFB, generates pull up and pull down control signals by comparing the reference voltage VREF with the VBLP. The output driver 110 performs a pull up or a pull down operation according to the pull up and pull down control signals for increasing or decreasing the level of the VBLP.

The mirror-type amplifier 100 includes an NMOS transistor NM21 as a dead zone to prevent a leakage current. Because the NMOS transistor NM21 operates to reduce the level of a gate voltage of a NMOS transistor NM22, it is prevented for the NMOS transistor NM22 from being turned on abnormally at a low level of the gate voltage. Accordingly, the mirror-type amplifier 100 prevents the leakage current in the output driver 110.

However, the voltage level for turning on the NMOS transistor NM22 increases and an operation timing for turning on the NMOS transistor NM22 is delayed. Finally, a whole response of the internal voltage generator is delayed. It is difficult to generate an internal voltage capable of supporting predetermined operations required in an active mode.

A circuit operation of a semiconductor memory device may be performed in a standby mode or an active mode. The conventional internal voltage generator uses the mirror-type amplifier 100 in both the standby and active modes. Accordingly, while minimizing the leakage current generated in standby mode, the conventional internal voltage generator is inefficient to generate the VBLP capable of supporting operations, such as a precharge operation, required in the active mode.

SUMMARY OF THE INVENTION

Embodiments of the present invention are directed at providing an internal voltage generator of a semiconductor memory device, capable of changing driving abilities depending on whether it is in standby mode or active mode, so as to respond faster in the active mode and prevent a leakage current in the standby mode.

In accordance with an aspect of the present invention, the internal voltage generator of a semiconductor memory device comprises a driving controller for generating drive control signals having information about standby and active modes, a first voltage generator enabled by the drive control signals for comparing an internal voltage with a reference voltage in the standby and active modes, a first driver for generating the internal voltage according to a comparison result of the first voltage generator, a second voltage generator enabled by the drive control signal for comparing the internal voltage with the reference voltage in the active mode, and a second driver for generating the internal voltage according to a comparison result of the second voltage generator.

DESCRIPTION OF SPECIFIC EMBODIMENTS

The present invention is provided with an operational amplifier (OP AMP) to enable a higher driving ability in an active mode, as compared with a standby mode. The driving ability refers to an ability to generate an internal voltage stably. In accordance with the present invention, a slow response speed and insufficient supply of the internal voltage are improved in the active mode. While reducing current consumption in the standby mode, a stable voltage can be supplied faster in the active mode.

Hereinafter, a semiconductor memory device in accordance with the present invention will be described in detail referring to the accompanying drawings.

Figure 1:
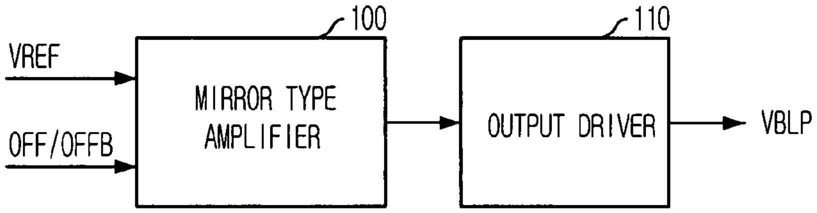
FIG. 1 is a block diagram of a conventional internal voltage generator.
Figure 2:
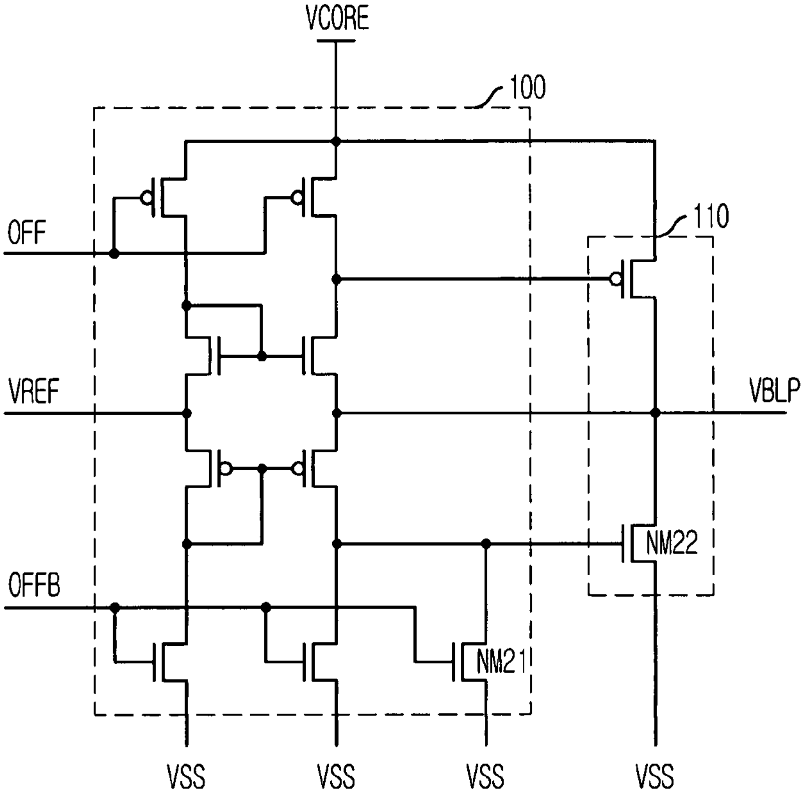
FIG. 2 is a schematic circuit diagram of the internal voltage generator described in FIG. 1.
Figure 3:
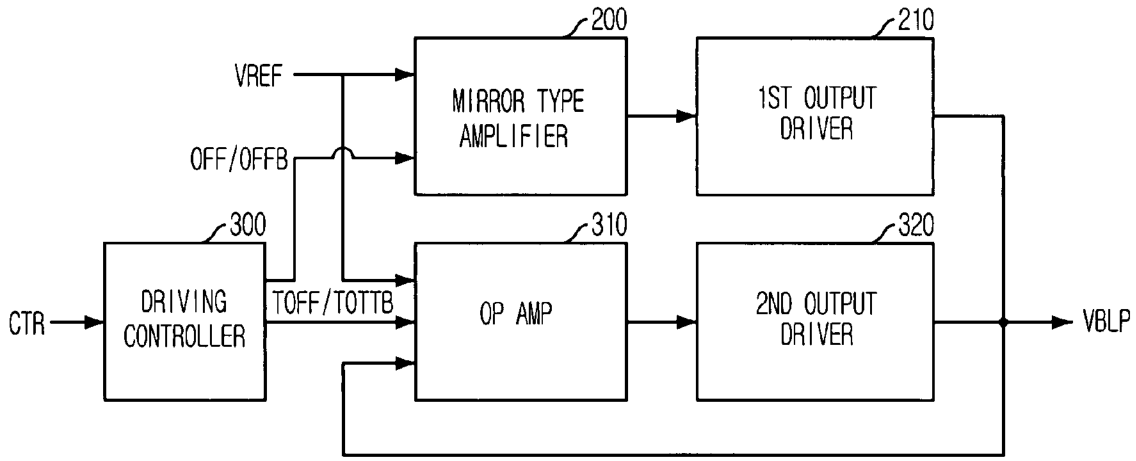
FIG. 3 is a block diagram of an internal voltage generator in accordance with the present invention.

FIG. 3 illustrates a block diagram of an internal voltage generator in accordance with the present invention. The internal voltage generator includes a mirror-type amplifier 200, a first output driver 210, driving controller 300, an OP AMP 310 and a second output driver 320.

The mirror-type amplifier 200 and the first output driver 210 are embodied as substantially identical structures as compared with the conventional embodiment. As the driving controller 300, the OP AMP 310 and the second driver 320 are provided, the VBLP has higher driving ability in the active mode than the standby mode.

The driving controller 300 receives a control signal CTR, which is enabled in the active mode. The driving controller 300 outputs drive control signals OFF and OFFB for controlling the mirror-type amplifier 100 and drive control signals TOFF and TOFFB for controlling the OP AMP 310. The drive control signals OFF, OFFB, TOFF and TOFFB contain information about the standby and active modes. The drive control signals OFF and OFFB are generated to control mirror-type amplifier 100 in both the standby and active modes. The drive control signals TOFF and TOFFB are generated to make the OP AMP 310 operate in the active mode.

The mirror-type amplifier 100 is activated according to the drive control signals OFF and OFFB, and generates a pull up and pull down control signals by comparing a reference voltage VREF with the VBLP. The mirror-type amplifier 100 is provided with a NMOS transistor, not shown in FIG. 3, as a dead zone. The first output driver 110 generates the VBLP in response to pull up and pull down control signals generated by the mirror-type amplifier 100.

The OP AMP 310 is enabled by the drive control signals TOFF and TOFFB, and generates pull up and pull down control signals by comparing the reference voltage VREF with the VBLP. The second output driver 320 generates the VBLP in response to a pull up and pull down control signals generated by the OP AMP 310.

Figure 4:
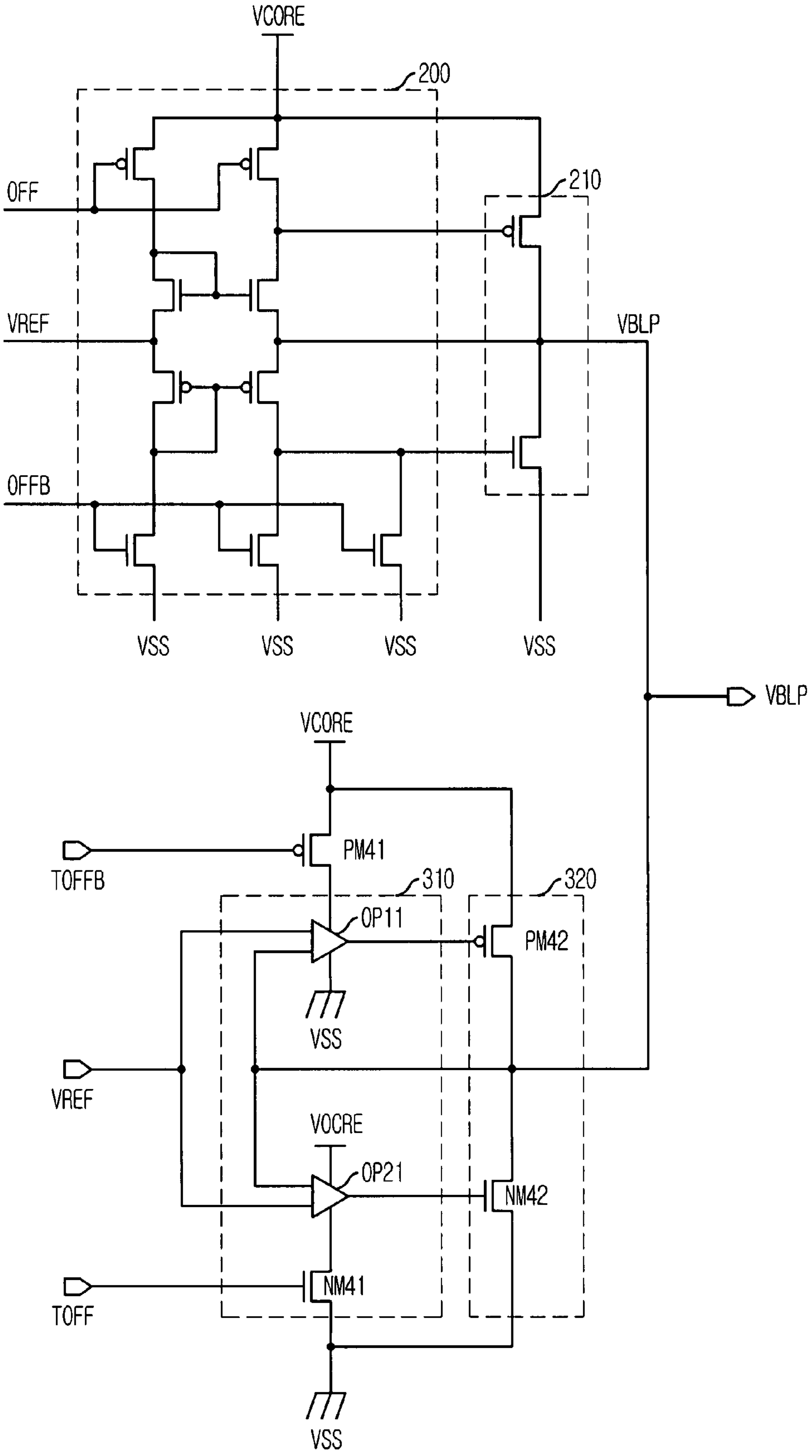
FIG. 4 is a schematic circuit diagram of the internal voltage generator described in FIG. 3.

FIG. 4 illustrates a schematic circuit diagram of the internal voltage generator described in FIG. 3. The mirror-type amplifier 200, enabled by the drive control signals OFF and OFFB, compares the reference voltage VREF with the VBLP. The output driver 210 performs a pull up or a pull down operation according to the comparison result for increasing or decreasing the VBLP.

The OP AMP 310 and the second output driver 320 in accordance with an embodiment of the present invention are described in detail. The OP AMP 310 includes first and second OP AMP units OP11 and OP21, a first PMOS transistor PM41 and a first NMOS transistor NM41. The first OP AMP unit OP11 compares the reference voltage VREF with the bit line precharge voltage VBLP, and outputs a pull up control signal. The first PMOS transistor PM41, receiving the drive control signal TOFFB through a gate, enables the first OP AMP unit OP11. The second OP AMP unit OP21 compares the reference voltage VREF with the VBLP, and outputs a pull down control signal. The first NMOS transistor NM41, receiving the drive control signal TOFF through a gate, enables the second OP AMP unit OP21. The first PMOS transistor PM41 is coupled between the first OP AMP unit OP11 and a core voltage VCORE. The first NMOS transistor NM41 is coupled between the second OP AMP unit OP21 and a ground voltage VSS.

The second output driver 320 includes a second PMOS transistor PM42 and a second NMOS transistor NM42. The second PMOS transistor PM42 pulls up the VBLP in response to the pull up control signal output from the OP AMP unit OP11. The second NMOS transistor NM42 pulls down the VBLP in response to the pull down control signal output from the OP AMP unit OP21. The second PMOS transistor PM42, coupled between the core voltage VCORE and an output node, receives the pull up control signal through a gate. The second NMOS transistor NM42, coupled between the ground voltage VSS and the output node, receives the pull down control signal through a gate.

Consequently, the driving controller 300 outputs the drive control signals OFF and OFFB to drive the mirror-type amplifier 200 in the standby and active modes. The driving controller 300 outputs the drive control signals TOFF and TOFFB to drive the OP AMP 310 in the active mode. The mirror-type amplifier 200 and the OP AMP 310 receiving the drive control signals OFF, OFFB, TOFF and TOFFB generate the VBLP to increase the driving abilities of the internal voltage in the active modes.

According to the present invention, an internal voltage generator prevents a leakage current in a standby mode by using a mirror-type amplifier, wherein a dead zone is set up. By operation of the mirror-type amplifier and an OP AMP in an active mode, the internal voltage also generates a VBLP having higher driving ability, compared with a VBLP generated in the standby mode. Moreover, because the faster OP AMP operates in the active mode, the level of the VBLP can be generated faster and more stably as compared with methods heretofore in use.

Besides generating the VBLP, the present invention may be applied to generating a cell plate voltage as an identical voltage level. Depending on the selection made for a reference voltage VREF, it is possible to generate a different level of voltage.

While the present invention has been described with respect to the particular embodiments, it will be apparent to those skilled in the art that various changes and modifications may be made without departing from the spirit and scope of the invention as defined in the following claims.

What is claimed is:

1. An internal voltage generator of a semiconductor memory device, comprising:

a driving controller for generating drive control signals having information about whether the device is in a standby mode or an active mode;

a first voltage generator enabled by the drive control signals for comparing an internal voltage with a reference voltage in both the standby and active modes;

a first driver for generating the internal voltage in response to a comparison performed by the first voltage generator;

a second voltage generator enabled by the drive control signal for comparing the internal voltage with the reference voltage while the device is in the active mode; and a second driver for generating the internal voltage in response to a comparison performed by the second voltage generator.

2. The internal voltage generator of claim 1, wherein the internal voltage includes a bit line precharge voltage or a cell plate voltage.

3. The internal voltage generator of claim 1, wherein the second voltage generator includes:

a comparator for comparing the reference voltage and the internal voltage and outputting the comparison result; and a controller for enabling the comparator in response to the drive control signals.

4. The internal voltage generator of claim 3, wherein the comparator includes:

a pull up control signal generator for comparing the reference voltage and the internal voltage and outputting a pull up control signal; and a pull down control signal generator for comparing the reference voltage and the internal voltage and outputting a pull down control signal.

5. The internal voltage generator of claim 3, wherein the controller coupled between a supply or a ground voltage and the comparator includes a switching unit activated according to the drive control signals.

6. The internal voltage generator of claim 4, wherein the pull up signal generator includes an operational amplifier.

7. The internal voltage generator of claim 4, wherein the pull down signal generator includes an operational amplifier.

8. The internal voltage generator of claim 4, wherein the second driver includes:

a pull up unit for pulling up the internal voltage in response to the pull up control signal; and a pull down unit for pulling down the internal voltage in response to the pull down control signal.

9. The internal voltage generator of claim 8, wherein the pull up unit includes a MOS transistor which is coupled between a core voltage and an output node and receives the pull up control signal through a gate.

10. The internal voltage generator of claim 8, wherein the pull down unit includes a MOS transistor which is coupled between the ground voltage and an output node and receives the pull down control signal through a gate.

11. The internal voltage generator of claim 1, wherein the first voltage generator includes a mirror-type amplifier.

* * * * *